(12) United States Patent
Lin

(10) Patent No.: US 9,229,080 B2
(45) Date of Patent: Jan. 5, 2016

(54) METHOD FOR RECONSTRUCTING IMAGES OF A MULTI-CHANNEL MRI SYSTEM

(71) Applicant: National Taiwan University, Taipei (TW)

(72) Inventor: Fa-Hsuan Lin, Taipei (TW)

(73) Assignee: National Taiwan University, Taipei (TW)

( * ) Notice: Subject to any disclaimer, the term of this patent is extended or adjusted under 35 U.S.C. 154(b) by 22 days.

(21) Appl. No.: 13/969,682

(22) Filed: Aug. 19, 2013

(65) Prior Publication Data

US 2014/0119626 A1    May 1, 2014

(30) Foreign Application Priority Data

Oct. 25, 2012    (TW) .............................. 101139438 A

(51) Int. Cl.
| | |
|---|---|
| G06K 9/00 | (2006.01) |
| G01R 33/56 | (2006.01) |
| G01R 33/44 | (2006.01) |
| G01R 33/3415 | (2006.01) |

(52) U.S. Cl.
CPC .............. *G01R 33/56* (2013.01); *G01R 33/445* (2013.01); *G01R 33/3415* (2013.01)

(58) Field of Classification Search
CPC ...... G06T 1/0007; G06T 7/0012; G06T 11/03
USPC ......................................................... 382/131
See application file for complete search history.

(56) References Cited

U.S. PATENT DOCUMENTS

| | | | | |
|---|---|---|---|---|
| 8,400,152 | B2 * | 3/2013 | Lin ............................... | 324/309 |
| 8,472,688 | B2 * | 6/2013 | Samsonov et al. ............ | 382/130 |
| 8,692,549 | B2 * | 4/2014 | Grady et al. .................. | 324/309 |
| 8,781,197 | B2 * | 7/2014 | Wang et al. ................... | 382/131 |
| 2009/0087057 | A1 * | 4/2009 | Parker et al. .................. | 382/131 |
| 2010/0308824 | A1 * | 12/2010 | Grady et al. .................. | 324/309 |
| 2012/0081114 | A1 * | 4/2012 | Weller et al. .................. | 324/309 |

OTHER PUBLICATIONS

Brau, Anja C.S.; Beatty, Phillip J; Skare, Stefan;Bammer, Roland. "Comparison of Reconstruction Accuracy and Efficiency Among Autocalibrating Data-Driven Parallel Imaging Methods". Magnetic Resonance in Medicine. 2008.*
Fa-Hsuan Lin, Panu Vesanen, Yi-Cheng Hsu, Jaakko Nieminen, Koos Zevenhoven, Juhani Dabek, Andrey Zhdanov, Lauri Parkkonen, Risto Ilmoniemi; Suppress ultra-low-field MRI noise using a data consistency constraint; Conference; OHBM 2012; Beijing, China.
H.P. Fautz, M. Honal, U. Saueressig, O. Schafer, S.A.R. Kannengiesser; Artifact Reduction in Moving-Table Acquisitions Using Parallel Imaging and Multiple Averages; Magnetic Resonance in Medicine 57:226-232 (2007).
Fa-Hsuan Lin, Teng-Yi Huang, Nan-Kuei Chen, Fu-Nien Wang, Steven M. Stufflebeam, John W. Belliveau, Lawrence L. Wald, Kenneth K. Kwong; Functional MRI Using Regularized Parallel Imaging Acquisition; Magnetic Resonance in Medicine 54:343-353 (2005).
Michael Lustig, David Donoho, John M. Pauly; Sparse MRI: The Application of Compressed Sensing for Rapid MR Imaging; Magnetic Resonance in Medicine 58:1182-1195 (2007).

* cited by examiner

*Primary Examiner* — Kim Vu
*Assistant Examiner* — Molly Delaney
(74) *Attorney, Agent, or Firm* — Bacon & Thomas, PLLC

(57) ABSTRACT

This disclosure provides an method for reconstructing a multi-channel magnetic resonance image (MRI), comprising: measuring k-space data at each channel of a multi-channel MRI system coil array; reinforcing the consistency of the k-space data to suppress the noise in the k-space data by a linear relationship among the k-space data at different channels; and reconstructing a magnetic resonance image by the multi-channel k-space data wherein the consistency of the k-space data is reinforced.

18 Claims, 4 Drawing Sheets

METHOD FOR RECONSTRUCTING IMAGES OF A MULTI-CHANNEL MRI SYSTEM

TECHNICAL FIELD

The present disclosure relates to the reconstruction of a magnetic resonance image (MRI), and more particularly, to the reconstruction of magnetic resonance image using data collected by a multi-channel coil array.

BACKGROUND

MRI has become an indispensible resource in clinical medicine because of its non-invasiveness and excellent contrast between soft tissues without using ionizing radiation. From the clinical perspective, MRI still faces significant challenges. First, a strong magnet is usually required to generate a sufficient magnetization to be detected by NMR techniques. The price of a strong magnet (1.5 T and above) constitutes a major part of the cost of an MRI system. Its weight also excludes MRI applications in a mobile or remote setting, such as ambulance, space station, or battlefield. Obese patients cannot obtain MRI due to the limitation of the bore size of the magnet (the maximal bore diameter is around 70 cm). Second, because of potential mechanical or electrical hazards, taking MRI from patients with metallic or electronic objects is difficult. However, imaging patients with wounds caused by metallic objects or with interventional devices (for example, in the intensive care unit or the emergency room) is clinically desirable.

Ultra low field (ULF) MRI has been developed as a potential solution to mitigate the above-mentioned challenges; ULF-MRI systems use magnetic field strength in the range of microteslas to milliteslas, making possible instrumentation at low cost, light weight, and open access. ULF-MRI systems have the advantages of metal compatibility and high $T_1$ contrast; however, one major technical challenge of ULF MRI is its low signal-to-noise ratio (SNR). To address this issue, it has been suggested to separately use a stronger pre-polarization magnet (in the range of tens of milliteslas) for magnetization generation while a weaker signal detection magnet (in the range of tens of microteslas) is used for magnetization precession. Additionally, highly sensitive superconducting quantum interference devices (SQUIDs) are typically used to detect the weak magnetic fields; a SQUID array with up to tens and even hundreds of sensors can be used in an ULF-MRI system for signal detection. Even with the two above-mentioned techniques, the signal to noise ratio of the measurement of an ULF MRI is still needed to be improved. Therefore, by means of signal processing, the present invention intends to suppress the noise in the measurement from a multi-channel MRI system and reinforce the consistency of the measured data.

SUMMARY

In multi-channel magnetic resonance imaging, there is a linear relationship among the magnetic resonance signals from different channels of a coil array, this linear relationship among the multi-channel k-space data of a coil array implies redundancy in the data; here, the word 'coil' is used to represent a pickup coil in the ULF-MRI system and a radio-frequency (RF) coil in high field MRI. In fact, this linear relationship (or redundancy) among the data has been reported in high-field parallel MRI aiming at improving the spatiotemporal resolution at the cost of SNR (Lustig, M. and J. M. Pauly, SPIRiT: Iterative self-consistent parallel imaging reconstruction from arbitrary k-space. Magn Reson Med, 2010. 64(2): p. 457-71). However, in an ULF-MRI system, the SNR is the most important and cannot be sacrificed for enhancing data acquisition efficiency or resolution.

Different from aiming at achieving a higher spatiotemporal resolution, parallel MRI can exploit the redundancy among channels of a coil array to suppress the artefacts during imaging by either pursuing the consistency of the k-space data, image, or coil sensitivity maps (Fautz, H. P., et al., Artifact reduction in moving-table acquisitions using parallel imaging and multiple averages. Magn Reson Med, 2007. 57(1): p. 226-32).

The present invention, nevertheless, uses the redundancy among the k-space data from different channels of a coil array to improve the signal to noise ratio, which can be applied to an ULF-MRI system as well as a high field MRI system to improve the image quality of these systems. The present invention provides a method for reconstructing a multi-channel magnetic resonance image, comprising: measuring k-space data at each channel of a multi-channel MRI system coil array; reinforcing the consistency of the k-space data to suppress the noise in the k-space data by a linear relationship among the k-space data at different channels; and reconstructing a magnetic resonance image by the multi-channel k-space data wherein the consistency of the k-space data is reinforced. Here, the linear relationship among the k-space data means the k-space datum at a certain channel and at a k-space coordinate can be represented by a linear combination of the k-space data at other channels in the system in the vicinity of that k-space coordinate.

To suppress the noise further, the present invention proposes to integrate the image sparsity information into the procedure of reinforcing the data consistency. The present invention further provides method for reconstructing a multi-channel magnetic resonance image, comprising: measuring k-space data at each channel of a multi-channel MRI system coil array; reinforcing the consistency of the k-space data to suppress the noise in the k-space data by a linear relationship among the k-space data at different channels; suppressing the noise in the k-space data further by utilizing an image sparsity information; and reconstructing a magnetic resonance image by the multi-channel k-space data wherein the consistency of the k-space data is reinforced and the noise in the k-space data is further suppressed.

DETAILED DESCRIPTION OF THE DISCLOSURE

Theory

Previously it has been reported that when the sensitivity map for each channel of a coil array is spatially distinct, the k-space data from each channel are locally and linearly correlated with data from other channels in k-space. Specifically, using $d_i(k_m)$ to denote the complex-valued k-space data at the $i^{th}$ channel and at k-space coordinate $k_m$, we have $$d_i(k_m) = \sum_{\{channels; neighbors\ of\ k_m\}} \alpha_j \cdot d_j(k_{[m]}),\ j \neq i, \quad [1]$$

where $k_{[m]}$ denotes the k-space coordinates in the vicinity of $k_m$ (excluding $k_m$). $\alpha_j$ are the fitting coefficients with the index j indicating different channels of the coil and neighbors of $k_m$. Note that the definition of vicinity here is closely related to the spatial smoothness of the coil sensitivity maps. Among methods of pMRI reconstruction, SPIRiT is a method that synthesizes missing k-space data by using one single lattice structure to linearly correlate neighboring k-space data points from all receiver coils. Eq. [1] is actually a convolution operation using weightings $\alpha_i$ over data $d_i$ and has a matrix representation:

$$d = Ad, \quad [2]$$

where d denotes the vertical concatenation of $d_i$, all k-space data points in channel i. A is a matrix consisting of convolution kernel $\alpha_i$ (i=1 ... $n_c$). $n_c$ is the number of channels in a coil array. Eq. [2] describes the k-space data consistency among channels of an RF coil array. Reconstructing multi-channel MRI data enforcing this data consistency constraint can be formulated as an optimization problem:

$$\hat{d} = \underset{d}{\operatorname{argmin}} \|Ad - d\|_2^2 + \lambda \|Ed - d_0\|_2^2, \quad [3]$$

where the matrix E denotes the k-space sampling matrix of the acquisition. $d_0$ is the acquired data across all channels of a coil array. $\lambda$ is a regularization parameter adjusting the weightings between two error terms: the data consistency term $\|Ad-d\|_2^2$ and the measurement consistency term $\|Ed-d_0\|_2^2$. Here $\|.\|_2^2$ denotes the L-2 norm.

The convolution kernel matrix A was first estimated from full-sampled non-diffusion weighted ($b_o$) image, which has a higher SNR than diffusion weighted images. Unknown coefficients of A can be derived from the least-squares solution. Subsequently, the least squares solution of Eq. [3] was calculated iteratively using a conjugated gradient method based on the estimated A, sampling matrix E, and experimental data d. The regularization parameter $\lambda$ was chosen to be 1 in this study in order to avoid bias toward either error term.

Figure 1:
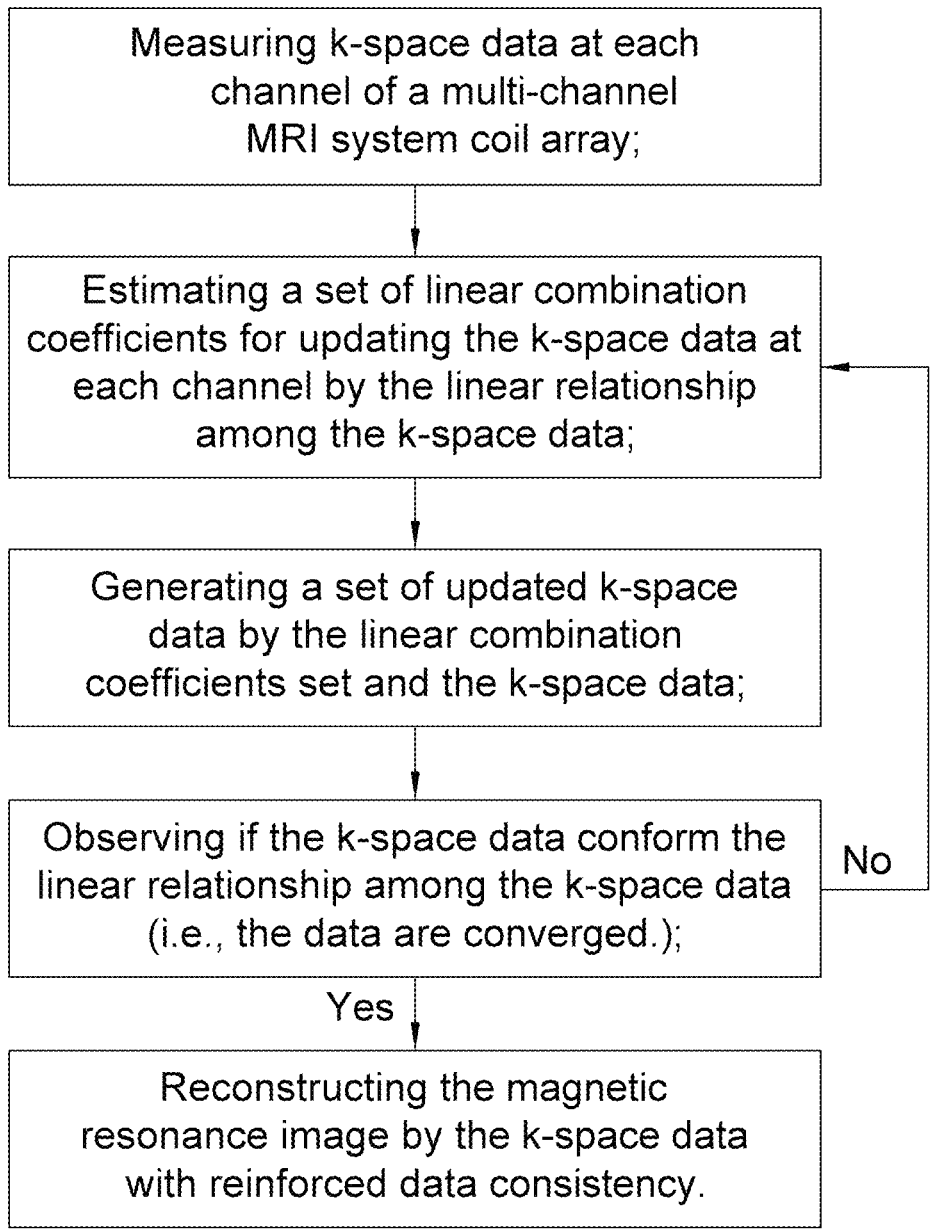
FIG. 1 is a procedure diagram showing the reconstruction of a multi-channel magnetic resonance image applying the data consistency constraint.
Figure 2:
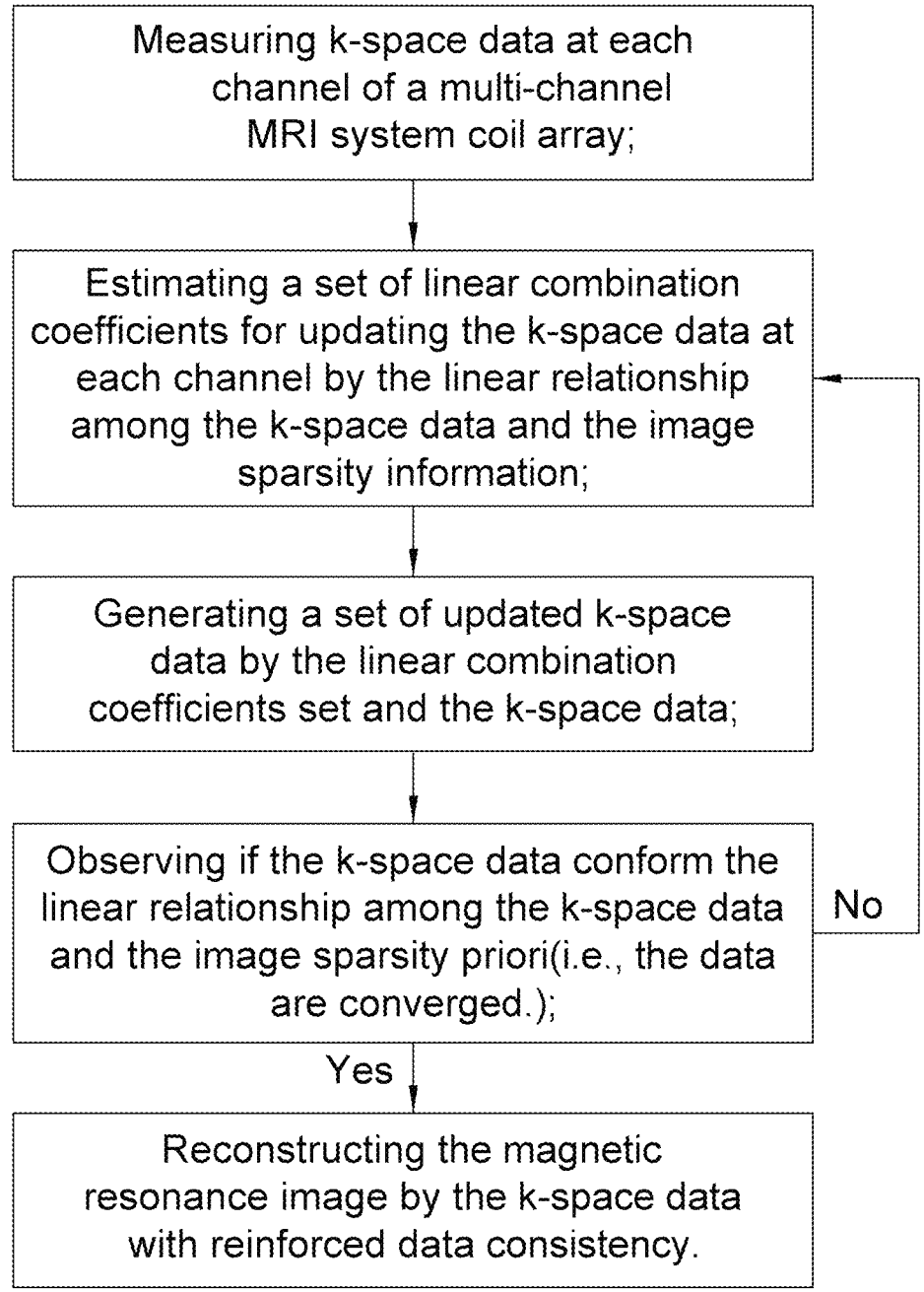
FIG. 2 is a procedure diagram showing the reconstruction of a multi-channel magnetic resonance image applying the data consistency constraint incorporated with a priori image sparsity information.

In addition, the priori image sparsity information can be incorporated to regularize the estimation of d:

$$\hat{d} = \underset{d}{\operatorname{argmin}} \|Ad - d\|_2^2 + \lambda \|Ed - d_0\|_2^2 + \lambda_s \|TFd\|_1^1, \quad [4]$$

where F denotes the Fourier transform, and T denotes a 'sparsifying' transformation, such as taking the difference between a selected voxel and the average of its neighboring voxels. $\|\bullet\|_1^1$ denotes taking the $l_1$-norm. $\lambda_s$ is a regularization parameter. The cost quantifying the 'sparsity' of the image in the transformed domain $\|TFd\|_1^1$ is closely related to the MRI reconstruction using compressed sensing (Lustig, M., D. Donoho, and J. M. Pauly, Sparse MRI: The application of compressed sensing for rapid MR imaging. Magn Reson Med, 2007. 58(6): p. 1182-95; Knoll, F., et al., Second order total generalized variation (TGV) for MRI. Magn Reson Med, 2011. 65(2): p. 480-91). The procedure of reconstructing a multi-channel magnetic resonance image applying the data consistency constraint incorporated with the priori image sparsity information is given in FIG. 2.

In the procedure described above, Eq. [4] was calculated in practice by the iterative re-weighted least-squares algorithm (Gentle, J. E., Matrix algebra: theory, computations, and applications in statistics. Springer texts in statistics. 2007, New York, N.Y.; London: Springer. xxii, 528), which uses a computationally efficient weighted least-squares estimator with a diagonal weighting matrix changing over iteration to approximate the exact solution of Eq. [4].

Embodiment

The detailed embodiments accompanied with the drawings will illustrate the present invention. It is to be noted that the embodiments of the present invention are exemplary and the present invention is not limited to the embodiments. The embodiments provided make the disclosure of this invention complete and clear; therefore, those skilled in the related art can make and use this invention.

Figure 3:
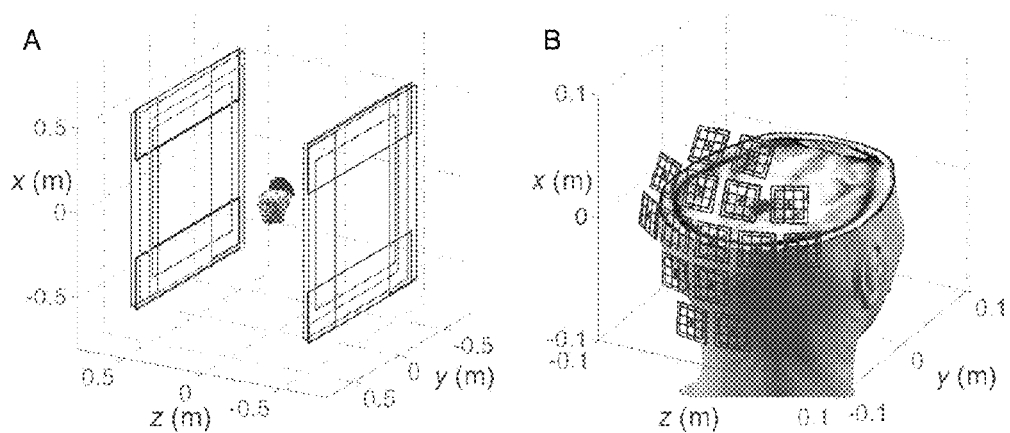
FIG. 3 shows the ULF-MRI system used in the embodiments of the present invention.

In the embodiments, an ULF-MRI system is used; the ULF-MRI has 47 SQUID sensors distributed over the occipital lobe in a helmet-shaped dewar (FIG. 3). The field sensitivity of the sensors were 4 fT/√Hz for magnetometers and ~4 fT/cm/√Hz for gradiometers. A constant magnetic field $B_0$=50 T was applied for magnetization precession along the z direction in FIG. 3. The detection-array geometry of the ULF-MRI system was used for the simulation of the first embodiment; and the ULF-MRI system is used for the hand and brain imaging in the second and the third embodiments.

In the first embodiment, the ULF-MRI system shown in FIG. 3 was used for hand imaging. Experimental data were acquired using a 3D spin-echo sequence with TE=80 ms to generate hand images of 6 mm×7.1 mm in-plane resolution (slice thickness 10 mm) using a maximal gradient strength of 85 μT/m. Before each k-space read-out measurement, the sample was polarized in a 15-mT field for 1 s. The total imaging time was 35 minutes.

Figure 4:
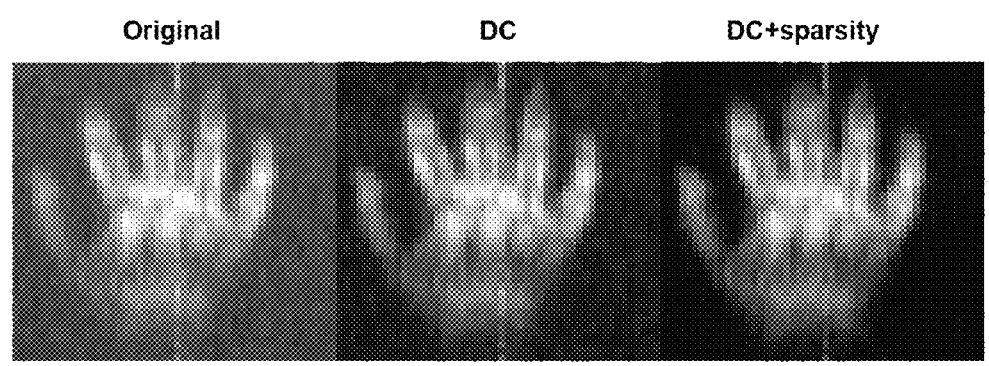
FIG. 4 gives the experimental images of a hand in the first embodiment by the ULF-MRI system.

FIG. 4 gives the experimental images of a hand in the first embodiment. The SoS image of the ULF-MRI data shows five digits and the palm. Notably, there is a clear vertical strip artifact in the SoS image, potentially due to the SQUID noise at 3 kHz in our system. Using the data consistency constraint alone ($\lambda$=10 and $\lambda_s$=0), the reconstructed image reduced the vertical strip artifact and the background noise ($\sigma$=0.012) significantly. Further using the sparsity priori ($\lambda$=10 and $\lambda_s$=$10^{-6}$) gave a similar reconstructed image as the reconstruction with using data consistency constraint alone.

In the second embodiment, the ULF-MRI system shown in FIG. 3 was used for brain imaging. For the brain images, a 3D spin-echo sequence is used with TE=80 ms, 4 mm×4 mm in-plane resolution (slice thickness 6 mm), and a maximal gradient strength of 112 μT/m. Before each k-space read-out measurement, the sample was polarized in a 22-mT field for 1 s. The total imaging time was 90 minutes.

Figure 5:
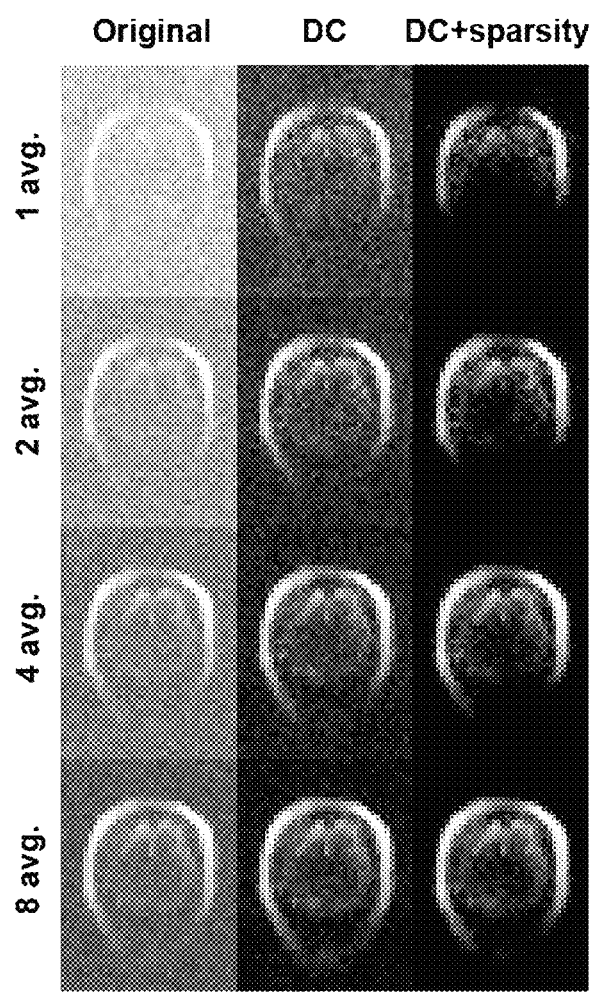
FIG. 5 gives the experimental images of a brain in the second embodiment by the ULF-MRI system.

One coronal slice of brain images with 1, 2, 4, and 8 averages from the ULF-MRI system are shown in FIG. 5. The shapes of the skull and brain parenchyma can be observed in the SoS image. It is found that signals potentially from gray and white matter increased as the data consistency constraint was applied ($\lambda$=10 and $\lambda_s$=0). Background noise was further suppressed after adding the sparsity constraint ($\lambda$=10 and $\lambda_s$=$10^{-6}$).

The embodiments of the present invention demonstrate the use of the data consistency constraint in reconstructing multi-channel magnetic resonance image can reduce the noise level and can thus increase the SNR of the reconstructed image. Besides, the embodiments also show the use of the data consistency constraint incorporated with the priori image sparsity information can suppress the noise further; however, the over-reliance on the sparsity constraint (a larger $\lambda_s$ parameter) causes the loss of image features with a lower contrast. Therefore, it is crucial to select an optimized $\lambda_s$ value.

The ULF-MRI system used in the embodiments is based on a magnetoencephalography (MEG) system. Noise suppression is a critical procedure in both ULF-MRI and MEG data processing. The method present in this invention is different from the signal-space projection (SSP) and signal-space separation (SSS) methods in MEG processing, both of which are spatial filtering methods to separate measurements into signal and noise components and to remove the latter. The data consistency constraint, however, is based on the k-space formulation, which is a unique property in MRI (MEG does not have similar spatial encoding). However, it is expected that this method can be integrated with SSP and SSS to further suppress noise and thus to improve the image quality from an ULF-MRI system.

Another issue related to incorporating the sparsity priori is the choice of a transformation to sparsify the image. Here the total variation based on a local Laplacian operator is used to sparsify the image. It is as well possible to use the wavelet transform to achieve a sparse representation. It is found that the difference is marginal.

To sum up, the data consistency constraint used in the present invention is the unique property of multi-channel MRI systems; therefore, the application of this constraint should not be limited to ULF-MRI systems; this property can be applied in all kinds of multi-channel MRI systems plagues by noise and can be integrated with other noise-suppressing signal processing method to enhance the image quality further.

What is claimed is:

1. A method for reconstructing a an image with a magnetic resonance image (MRI) system that includes a radio frequency (RF) coil array having multiple coil channels, the method comprising:
   a. measuring a first set of complex-valued k-space data at each channel of a multi-channel coil array;
   b. reinforcing the linear relationship between each data point of the first set of k-space data in one channel of the coil array and its neighboring k-space data points in other channels of the coil array to generate a second set of k-space data; and
   c. reconstructing a magnetic resonance image using the second set of k-space data;
   wherein said reconstructing the magnetic resonance image in step c. is calculated based on a data consistency term associated with the first set of complex-valued k-space data and a measurement consistency term associated with the second set of k-space data.

2. The method according to claim 1, wherein step b. is achieved by a procedure comprising:
   using the first set of k-space data at each channel of the multi-channel coil array to estimate a set of linear combination coefficients, which describes the linear relationship between each data point of the first set of k-space data in one channel of the coil array and its neighboring k-space data points in other channels of the coil array;
   generating the second set of k-space data such that the second set of k-space data is simultaneously similar to the first set of k-space data and to a set of synthesized k-space data wherein each data point of the set of synthesized k-space data is the linear combination of its neighboring k-space data points using the set of linear combination coefficients.

3. The method according to claim 2, wherein estimating the set of linear combination coefficients uses the third set of k-space data collected in a separate MRI measurement using the same RF coil array.

4. The method according to claim 2, wherein estimating the set of linear combination coefficients is based on least squares fitting.

5. The method according to claim 2, wherein the similarity between the first and the second sets of the k-space data and the similarity between the second and the set of synthesized k-space data is based on the sum of squares of the difference.

6. The method according to claim 2, wherein the similarity between the first set of k-space data and the second set of k-space data can be different from the similarity between the set of synthesized k-space data and the second set of k-space data.

7. The method according to claim 2, wherein the second set of k-space data can be generated by an iterative calculation procedure.

8. The method according to claim 2, wherein step b. is achieved by a procedure comprising:
   using the first set of k-space data at each channel of the multi-channel coil array to estimate a set of linear combination coefficients, which describes the linear relationship between each data point of the first set of k-space data in one channel of the coil array and its neighboring k-space data points in other channels of the coil array;
   generating the second set of k-space data such that the second set of k-space data is simultaneously similar to the first set of k-space data, similar to a set of synthesized k-space data wherein each data point of the set of synthesized k-space data is the linear combination of its neighboring k-space data points using the set of linear combination coefficients, and the second set of k-space data is sparse after applying the Fourier transform to the second set of k-space data to generate an image.

9. The method according to claim 8, wherein estimating the set of linear combination coefficients uses the third set of k-space data collected in a separate MRI measurement using the same RF coil array.

10. The method according to claim 8, wherein estimating the set of linear combination coefficients is based on least squares fitting.

11. The method according to claim 8, wherein the similarity between the first and the second sets of the k-space data and the similarity between the second and the set of synthesized k-space data is based on the sum of squares of the difference.

12. The method according to claim 8, wherein the similarity between the first set of k-space data and the second set of k-space data can be different from the similarity between the set of synthesized k-space data and the second set of k-space data.

13. The method according to claim 8, wherein the second set of k-space data can be generated by an iterative calculation procedure.

14. The method according to claim 8, wherein the similarity between the first set of k-space data and the second set of k-space data, the similarity between the set of synthesized k-space and the second set of k-space data, and the sparsity of the second set of k-space data after applying the Fourier transform to the second set of k-space data to generate the image can be different.

15. The method according to claim 8, wherein the sparsity of the second set of k-space data after applying the Fourier transform to the second set of k-space data to generate the image is measured by the L-p norm of the transformed image, where p is between 0 and 1.

16. The method according to claim 15, wherein the sparsity of the second set of k-space data after applying the Fourier transform to the second set of k-space data to generate an image can measured by wavelet transformation, Total variation transformation, or Laplacian transformation.

17. The method according to claim 1, wherein the data consistency term is calculated including a convolution operation using a plurality of weightings over the first set of complex-valued k-space data, while the measurement consistency term is calculated based at least on a k-space sampling matrix and an acquired data across the channels of the multi-channel coil array.

18. The method according to claim 17, wherein the data consistency term is a calculation associated with $|Ad-d|$ where A is associated with a matrix consisting of convolution kernel and d is associated with the vertical concatenation of the complex-valued k-space data, while the measurement consistency term is a calculation associated with $|Ed-d_0|$ where E is associated with the k-space sampling matrix; $d_0$ is associated with the acquired data across the channels of the multi-channel coil array.

* * * * *